United States Patent
Notohardjono et al.

(10) Patent No.: US 6,788,085 B2
(45) Date of Patent: Sep. 7, 2004

(54) SELF-ALIGNING WAFER BURN-IN PROBE

(75) Inventors: Budy D. Notohardjono, Poughkeepsie, NY (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 09/902,964

(22) Filed: Jul. 11, 2001

(65) Prior Publication Data

US 2003/0011394 A1 Jan. 16, 2003

(51) Int. Cl.⁷ .................................................. G01R 31/02
(52) U.S. Cl. ........................ 324/761; 324/754; 324/762
(58) Field of Search ................................ 324/761, 762, 324/754, 765, 758, 158.1, 763, 72.5; 439/482, 700, 67, 71, 66

(56) References Cited

U.S. PATENT DOCUMENTS

| | | | |
|---|---|---|---|
| 3,806,801 A | 4/1974 | Bove | 324/72.5 |
| 4,506,215 A | 3/1985 | Coughlin | 324/158 P |
| 4,622,514 A | 11/1986 | Lewis | 324/158 P |
| 4,686,464 A | 8/1987 | Elsasser et al. | 324/158 P |
| 4,774,462 A | 9/1988 | Black | 324/158 F |
| 4,901,013 A | 2/1990 | Benedetto et al. | 324/158 F |
| 4,963,822 A | 10/1990 | Prokopp | 324/158 P |
| 4,967,148 A | 10/1990 | Doemens et al. | 324/158 |
| 5,488,314 A | 1/1996 | Brandt et al. | 324/758 |
| 5,532,613 A | 7/1996 | Nagasawa et al. | 324/761 |
| 5,900,738 A * | 5/1999 | Khandros et al. | 324/761 |
| 5,974,662 A * | 11/1999 | Eldridge et al. | 324/754 |
| 5,977,787 A | 11/1999 | Das et al. | 324/761 |
| 6,043,667 A | 3/2000 | Cadwallader et al. | 324/758 |
| 6,206,273 B1 | 3/2001 | Beaman et al. | 228/180.5 |
| 6,404,211 B2 * | 6/2002 | Hamel et al. | 324/754 |

OTHER PUBLICATIONS

Kostenko Jr., A. High–Density Contactors to Electrical Space Transformers, IBM Technical Disclosure Bulletin, vol. 15, No. 10, Mar. 1973, p. 3035.

* cited by examiner

Primary Examiner—Evan Pert
Assistant Examiner—Jimmy Nguyen
(74) Attorney, Agent, or Firm—Lawrence D. Cutter

(57) ABSTRACT

The material and geometric properties of an electrical probe contact are combined to produce an electrical contact which is capable of self-alignment over many thousands of uses. The probe contact moves substantially only in a vertical direction and provides a consistent contact force with corresponding electrical contact pads on a semiconductor wafer. The probe contacts are configured in an array of a large plurality of individual contacts which extend from a base to which they are attached through apertures in an overlying mask spaced apart from the base.

9 Claims, 4 Drawing Sheets

SELF-ALIGNING WAFER BURN-IN PROBE

BACKGROUND OF THE INVENTION

The present invention is generally directed to electrical probes used to make temporary electrical connections to contact pads on semiconductor wafers. These probes provide an important electrical interconnection mechanism for applying voltages, for inserting signal inputs, and for measuring signal outputs for semiconductor wafers at stages of manufacture prior to their being cut into individual integrated circuit chips.

Generally speaking, the probes discussed herein include a large plurality of individual electrical contacts. These contacts typically number in the thousands. These contacts are arranged so that they match correspondingly placed electrically conductive pads which may be designed into a semiconductor wafer for test purposes. These probes possess many competing characteristics which make their design and construction very difficult. For example, it is important that the contacts do not experience any significant distortion which would interfere either with their horizontal or with their vertical alignment. This could result in non-alignment with the corresponding contact pads on the wafer. In this regard, it is noted that these pads and the probe's contacts are both very small and are spaced very close together.

When placed on a wafer, the probe, with its thousands of individual contacts, should make clean electrical contact with the pads on the wafer. Alignment should not only be easy to accomplish for each test, but the behavior and characteristics of the probe (or probe assembly, if you will) should be repeatable over many thousands of tests. With specific reference to the probe of the present invention, as described herein, it is noted that it is designed to withstand up to approximately 250,000 uses. After each test, the individual contact elements should not only return to the same position but should also thereafter still be capable of exerting the same force on the wafer contact pad. Furthermore, in this regard, it is noted that very specific force levels are desired. If the force exerted by the contacts when the probe is placed against a wafer is too small, properly repeatable electrical contact is not made with the wafer pads. On the other hand, the force should not be so large that the contact pads are damaged or affected in any way which would impact future readings obtained through the pad.

It is also very desirable that individual flexible probe contacts move in a vertical direction with substantially no horizontal components to the motion. Clearly, it is desirable that this feature be provided in as simple a manner as possible without the use of complicated mechanical arrangements which have their own mechanisms for high failure rate after only a few thousand uses. The feature of being able to move only in a relatively narrow vertical direction should also be repeatable over many thousands of uses. Additionally, the amount of vertical motion in such probes is typically relatively high in comparison to the dimensions involved. The large extent of this motion contributes to stresses which tend to shorten the useful life of the individual probe contacts.

Thus, it is seen that desirable probes include many thousands of contacts. Each of the contacts moves in a narrowly defined vertical direction. After repeated uses, the probe contacts exert the same force and return to the same positions ready again for the same vertical motion and ready again to exert the same force and make the same quality of physical and electrical contact. With each use the electrical contact resistance remains substantially the same with little or no wear on the probe contact tip. After repeated use, desirable probe contacts remain in substantially the same position as originally designed, both with respect to their horizontal position in an x-y plane and with respect to their vertical position, while still retaining their ability to move through the same vertical displacement with no substantial horizontal component to the motion.

SUMMARY OF THE INVENTION

In a preferred embodiment of the present invention an electrical probe assembly comprises a first substantially flat support or base upon which a plurality of flexible, self-supporting wire probes are affixed. The geometry of these wire probes and the materials employed in them constitute an important aspect of the present invention. A substantially flat mask having a plurality of apertures is disposed in a spaced apart relationship with respect to the base. The wire probes extend from the base through apertures in the mask. The wire probes include two oppositely directed bends which provide flexibility to the wire probes. The individual wire probes are plated to a thickness, p, and possess an inner core diameter of d. The two bends in the wire probes produce a horizontal displacement, L, between the point at which the wire probe is affixed to the base and the point at which the wire probe extends through an aperture in the mask. The ends of the wire probes extending through the apertures possess pointed tips for electrical contact with corresponding pads on semiconductor wafers. The parameters L, p, and d cannot be chosen independently while still preserving desirable properties of vertical motion, self-alignment, and long life. These parameters are chosen conjointly so as to define a point within three dimensional space as shown in the figures herein.

Accordingly, it is an object of the present invention to provide an improved probe for use in the testing of semiconductor wafers and similar devices.

It is also an object of the present invention to improve the testing of semiconductor wafers through the use of a more reliable probe used in making contact with pads on these wafers.

It is yet another object of the present invention to construct a probe which exhibits a long useful life even after thousands of repeated uses.

It is a further object of the present invention to construct improved wire probe elements for use in wafer probe assemblies.

It is a still further object of the present invention to construct wire probes which are capable of self-alignment.

It is also an object of the present invention to construct wire probes which are capable of motion in a vertical direction without substantial motion in a horizontal direction.

It is yet another object of the present invention to construct wire probes which provide substantially the same contact force even after thousands of uses.

It is a further object of the present invention to construct probe assemblies that are consistent with current measuring techniques and practices and which would not require retooling operations.

It is a still further object of the present invention to provide improved mechanisms for applying voltages to, injecting signals into, and acquiring output signals from semiconductor wafers and similar devices for test purposes.

It is yet another object of the present invention to construct a probe assembly, especially useful for wafer testing, which employs structures and materials which facilitate repeatable probe manufacture without resort to nonstandard methods or materials.

Lastly, but not limited hereto, it is an object of the present invention to provide probe wires and a probe assembly which is capable of making firm and consistently uniform connections to pads on semiconductor wafers during their testing.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
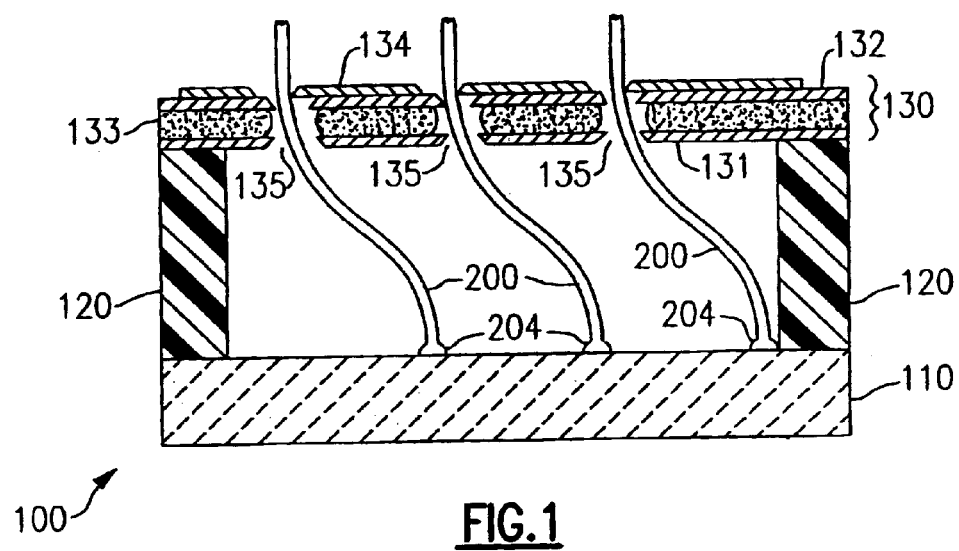
FIG. 1 is cross-sectional, side elevation view illustrating a preferred embodiment of the present invention.

The wafer probe of the present invention is meant to implement three important design features in a wafer probe. First is the ability to absorb high deflection distances, typically above 0.005". Second is durability which relates to the life of the probe under normal operating conditions. Referred to as the "number of touchdowns," the probe core material, probe plating as well as the shape are important contributors to this parameter. Third is the ability to maintain positional accuracy. Probe wires 200 are held in their x-y positions with mask 130 as shown in FIG. 1. The accuracy of this mask is important for maintaining accuracy during thousands of probe wire touchdowns. The profile of the integrated probe and the formation of the tip also contribute to proper x/y/z positioning of the probe.

FIG. 1 illustrates probe assembly 100 structured in accordance with preferred embodiments of the present invention. Probe wires 200 extend from base or support member 110 which preferably comprises ceramic material or materials. The essential characteristic of base 110 is that it be electrically insulative. Ceramic materials fulfill this role and also exhibit other desirable characteristics, namely, dimensional stability and compatability with other materials employed, namely, the metal in probe wire 200. Not shown in FIG. 1 are electrically conductive paths or wires which are disposed on the surfaces of base 110 and/or which pass through base 110. These wires or paths provide connections between probe assembly 100 and a testing apparatus.

It should also be noted that FIG. 1 is merely illustrative of the present invention. It is not shown to scale, particularly in the horizontal direction. Also, while FIG. 1 shows the presence of only three probe wires 200, in actual probes, there are typically thousands of such probe wires. Additionally, in terms of horizontal size, a desirable probe typically possesses substantially the same extent as the wafer with which it is designed to make connection. However, probes smaller in horizontal directions may also be employed. Probe wires 200 are typically arranged in an x-y grid pattern and are positioned so as to make contact with select conductive pads on semiconductor wafers. Each probe is specifically designed to mate with a specific wafer design and pad pattern. Since wafer probes therefore tend to be design-specific, it should therefore be easy to understand why it is desirable to use probes which possess a long useful life since one cannot simply pick a usable probe in an "off the shelf" manner. In use, probe 100 is placed in a jig or other alignment-controlling apparatus which also holds the semiconductor wafer to be tested. Semiconductor wafers typically include a notch or other indicia which is usable for alignment, positioning, or registration. A small force is exerted against probe 100 to provide the desired contact between probe wires 110 and semiconductor wafer pads (not shown). Although preferably designed for use across an entire wafer, probe assemblies of the present invention are also employable for contacting smaller wafer features or regions.

Probe assembly 100 of FIG. 1 also includes mask 130 which includes apertures 135 therein. Apertures 135 are of a size which is comparable to that of the outer diameter of probe wire 200 so that aperture 135 provides a guide for motion of probe wires 200 as probe wire tips 201 (see FIGS. 2 and 3) are urged against the wafer pads. Mask 130 is substantially flat, as is base 110. Mask 130 is disposed at a substantially fixed distance from base 110 by means of sidewall support or supports 120. Support 120 comprises any convenient feature, mechanism or means for supporting mask 130 at a substantially fixed distance from base 110. Sidewall support 120 preferably comprises material selected from the following group: ceramic, plastic, composite or metal. The most important quality for selecting a material for sidewall support 120 is its dimensional stability over time and use. In preferred embodiments of the present invention sidewall 120 comprises a foam material. While sidewall support 120 may comprise physically distinct and separate parts, it is preferred that it be formed as an integral unit. Such a structure is meant to provide dimensional stability and constancy in terms of the overall height of probe assembly 100. Uniformity in height helps to assure corresponding uniformity in applied contact force. In this regard, it is recalled from above that controlled contact force is a desirable aspect of the present invention: too much force damages the wafer pads and too little force fails to produce a desirably low and consistent contact resistance.

Mask 130 provides a mechanism for alignment of probe wires 200. Normally, probe wires 200 extend at least partially through apertures 135 in mask 130. When being used, tips 201 of probe wires 200 are flush with the top surface of mask 130 and are being urged against wafer pads with a controlled and designed-for force. The flatness of the top surface of mask 130 assures consistency of the designed-for contact force across all desired wafer pads. Mask 130 preferably comprises layers of materials that have a low coefficient of thermal expansion such as invar (layers 131, 132 and 134) and insulative material such as polyimide (layer 133). Mask 130 is preferably formed as a sandwich having three or more such layers.

Probe wires 200 include double bends that permit flexure in the vertical direction. Probe wire 200 is affixed to base 110 at base end 204 of wire probe 200. The preferred affixation method is via wire bonding to already in-place conductors disposed on or within ceramic base 110. After wire bonding, probe wires 200 are formed into a shape which provides compliance when probe tips 201 are brought into contact with electrically conductive pads on semiconductor wafers. When in place, probe wires 200 protrude slightly through aperture 135 in mask 130. Importantly for the present invention, probe wires 200 are affixed at a controlled horizontal distance between the point of affixation on base 110 and the point of protrusion through aperture 135 in mask 130. This distance is referred to herein as the offset and is referred to as the parameter L. The offset is provided by a double bend in probe wire 200. These bends preferably lie in substantially the same plane and are opposite in direction. Since each bend produces a location along wire probe 200 which is a high stress region and since regions of high stress can have a negative impact on longevity and useful probe life, a greater number of bends than two are undesirable, though not so undesirable as to absolutely preclude their use. Additionally, it is noted that, in preferred embodiments of the present invention, tip 201 of probe wire 200 is formed by a cutting operation as described in U.S. Pat. No. 6,206,273, issued Mar. 27, 2001, which is hereby incorporated herein by reference.

Probe wires 200 of the present invention preferably comprise core material which is either platinum or a platinum iridium alloy. Probe wires 200 are preferably plated with nickel, gold, a nickel alloy, or gold alloy.

Figure 2:
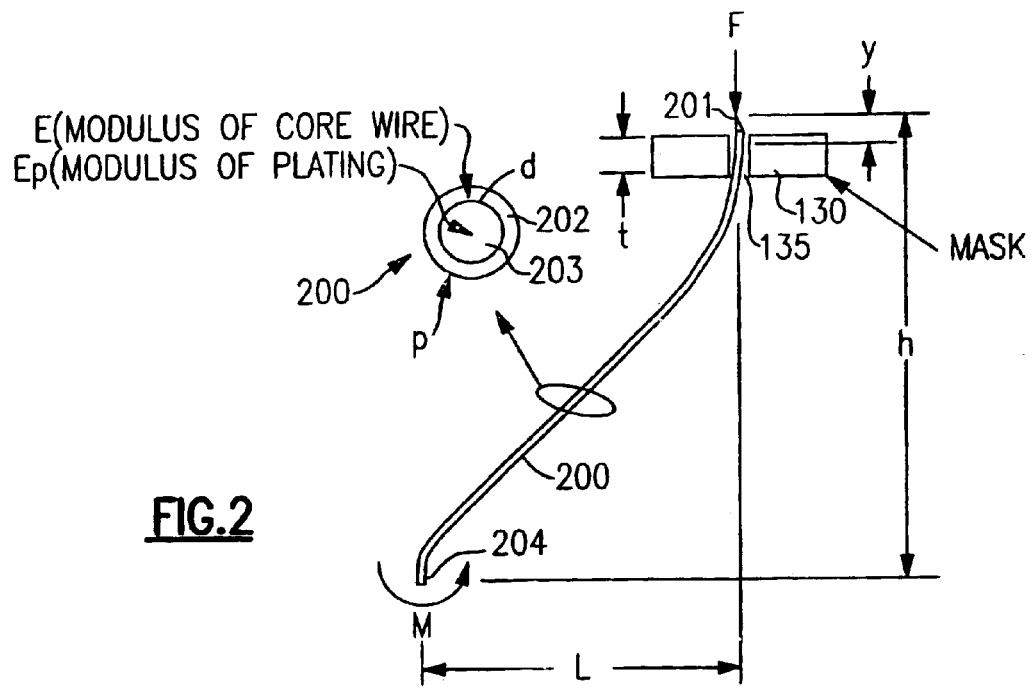
FIG. 2 is a side elevation view illustrating geometrical and material parameters used in constructing desirable probes in accordance with the present invention and particularly illustrating the important parameters of core diameter, d, plating thickness, p, and offset, L.
Figure 3:
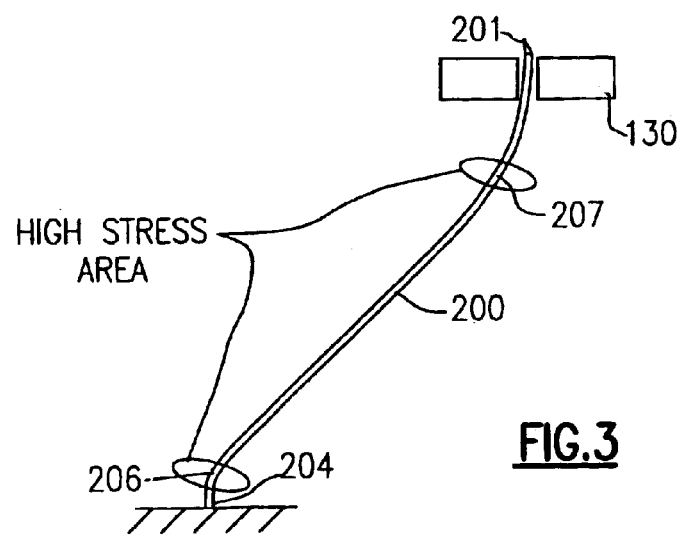
FIG. 3 is a view similar to FIG. 2, but more particularly pointing out areas of high stress which can influence probes of the type described herein.
Figure 4A:
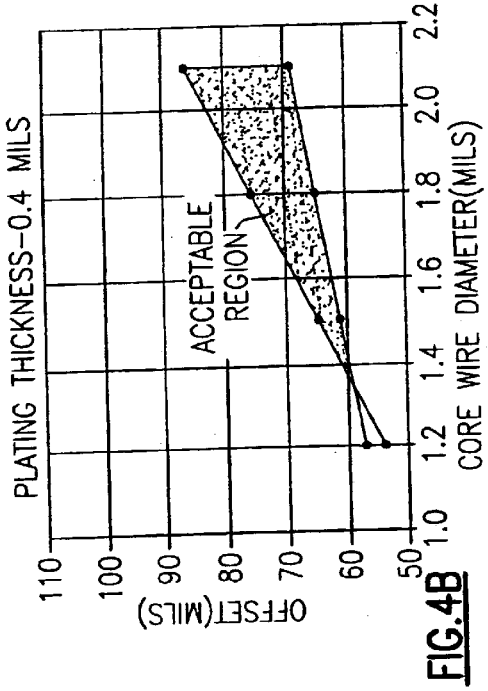
FIG. 4A is a plot of offset value, L, versus wire core diameter, d, for a plating thickness of L=0.3 mils which particularly shows acceptable values of L and d for probe wires used in the present invention.
Figure 4B:
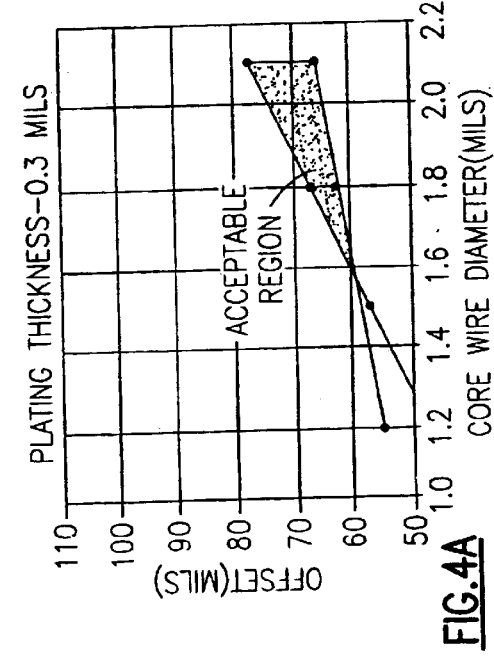
FIG. 4B is a plot similar to FIG. 4A except that it is directed to situations in which the plating thickness is L=0.4 mils.
Figure 4C:
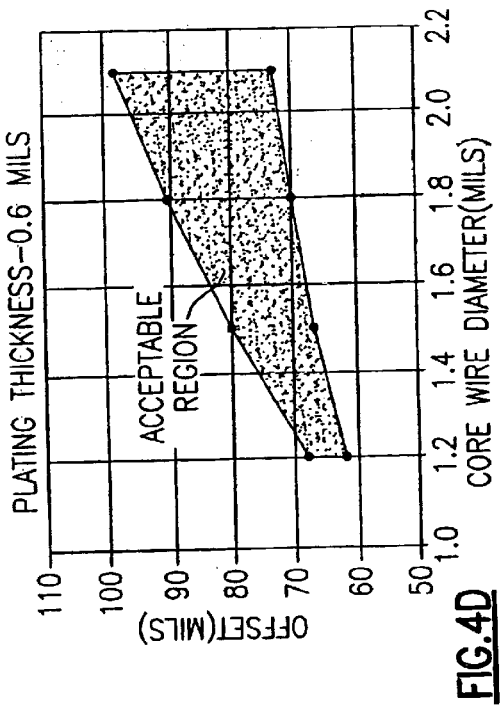
FIG. 4C is a plot similar to FIG. 4A except that it is directed to situations in which the plating thickness is L=0.5 mils.
Figure 4D:
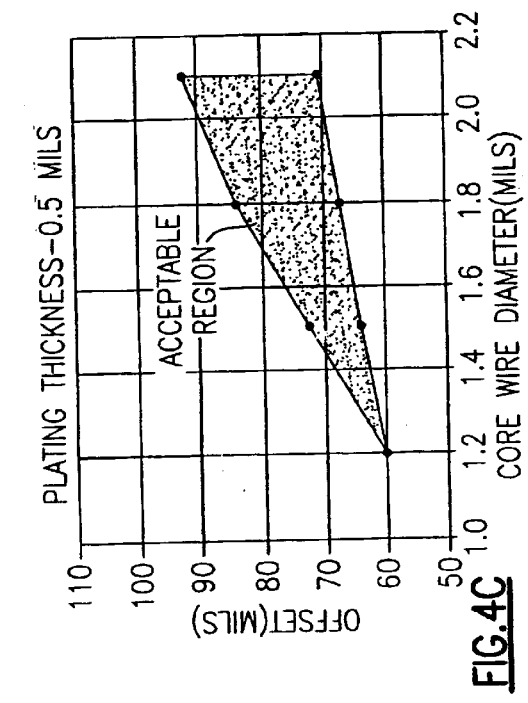
FIG. 4D is a plot similar to FIG. 4A except that it is directed to situations in which the plating thickness is L=0.6 mils.

As stated above, the present invention is directed to probe wire geometry as controlled by the selection of three important geometrical parameters: offset, L; plating thickness, p; and probe wire core diameter, d. These parameters are best appreciated from an examination of FIG. 2 which represents a partial enlargement of FIG. 1, together with a cross-sectional view of probe wire 200. FIG. 2 also illustrates the following additional parameters employed in the design of probe wire 200 and probe assembly 100: h, the extent of probe wire 200 in the vertical direction; y, the amount of vertical deflection of probe wire 200 during use; F, the force exerted by tip 201 of probe wire 200 during use; t, the thickness of mask 130; and M, the bending moment around affixation point 204 produced by force F. FIG. 2 also illustrates the fact that wire core 203 and plated material 202 both possess values for Young's Modulus, E and $E_p$, respectively. The parameter, h, also substantially determines the overall thickness of probe assembly 100. As more particularly illustrated in FIG. 3, probe wire 200 includes lower bend 206 and upper bend 207. These bends exhibit regions of high stress which tend to shorten probe life. FIG. 3 is also illustrative of the fact that, in preferred embodiments of the present invention, lower bend 206 is somewhat sharper than upper bend 207. Also lower bend 206 is near the bond region that could potentially soften the wire.

Figure 5:
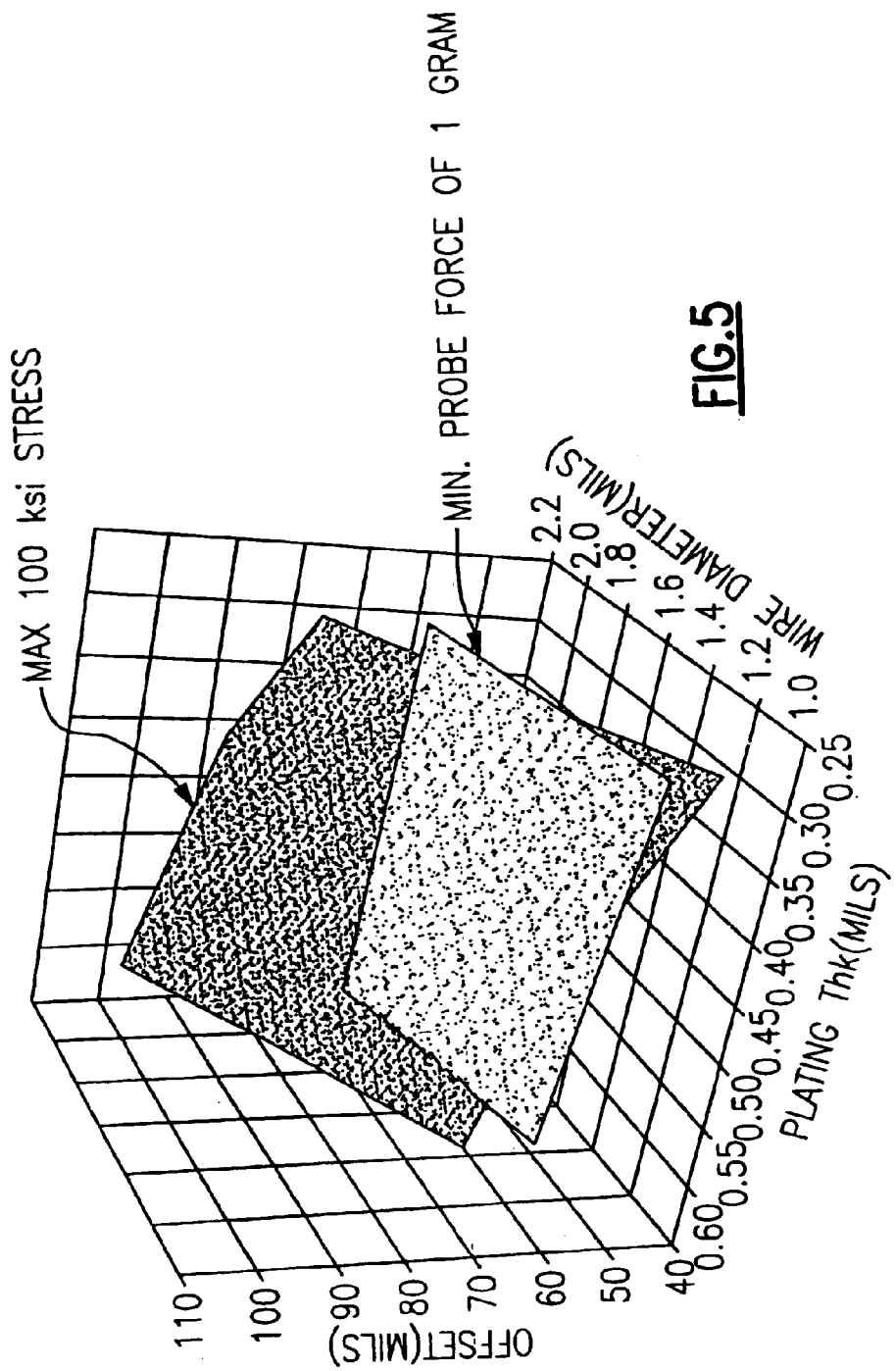
FIG. 5 is a three dimensional plot which illustrates an acceptable volume for points specified by coordinates p, L and d, which together indicate acceptable geometries for wire probes having desirable characteristics.

Important aspects of the present invention are illustrated in FIGS. 4A through 4D which are to be read together as providing one mechanism for conjointly selecting desirable values for the parameters L, p and d. They cannot be selected independently of one another. Nor can any two of them be selected without consideration of the third. The conjoint specification of these three parameters is thus seen to define a region in an abstract three-dimensional space. In addition to specification in the manner illustrated in FIGS. 4A through 4D, FIG. 5 provides an alternate specification in terms of indicating that the acceptable spatial volume in which these parameters lie is as shown as the volume between the two surfaces shown in FIG. 5. FIGS. 4A through 4D thus represent the lines that result when planar surfaces defined by p=constant intersect the surfaces shown in FIG. 5. Thus, while FIG. 5 represents a preferred isometric view for understanding the shape and extent of the volume encompassed by the present invention, FIG. 5 presents visual challenges in terms of "reading off" the parametric values associated with points within the volume. This defect is ameliorated by the use of FIGS. 4A through 4D which represent the situation for specific values of plating thickness, p: p=0.3 mils, p=0.4 mils, p=0.5 mils; and p=0.6 mils. For values of p between these selected values, linear interpolation provides an acceptable approximation in the p direction. Those of ordinary skill in the art will recognize that variations in the specified volume are possible, particularly in the direction of increased core wire diameter, d.

As discussed above, there is a complex dependence on the selection of geometric parameters and the attainment of wafer test probe assemblies having desirable properties of force consistency and durability. In particular, it is seen that to reduce stress to a level below 100 ksi (kilopounds per square inch), it is desirable to have an offset L which is greater than approximately 60 mils.

In the discussions above, coating 202 surrounding core 203 is described as a "plating." While this reflects a preferred embodiment of the present invention, in which an important aspect is the physical structure of probe wire 200, which comprises a substantially circular core of a first select material surrounded concentrically by another select material, it is noted that it is not essential that surrounding material 202 be formed by a plating operation. It is also possible to produce this structure via processes other than plating. For example, this same structure is producible through other methods such as: extrusion, dip coatings, sputtered coatings or sprayed on coatings or by combinations of such methods.

It is also noted that the discussions above refer to horizontal and vertical directions. The use of these terms, however, is relative to the figures provided herein. The use of these terms is not meant to indicate earthly or gravitationally driven directions. Nor is the use of these terms meant to suggest in any way operative or inoperative probe orientations. Rather, it is the case that the orientation of the probes of the present invention does not in any significant way impact their use or utility.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A probe assembly for making electrical contact with circuit elements on an integrated circuit wafer, or the like, said probe comprising:
   a first support which is substantially flat;
   a second support disposed on said first member and providing a sidewall structure which extends substantially vertically upward from said substantially flat first support;
   a substantially flat mask having at least one aperture therein, said mask being supported by said second support at a substantially uniform distance from said first support;
   a flexible, self-supporting wire probe affixed to said first support, said wire probe having a pointed end which extends at least partially through said at least one aperture, said wire probe having two substantially oppositely directed bends therein so as to permit said wire probe to flex in response to force applied to said pointed end;
   said wire probe comprising a core material selected from the group consisting of platinum and platinum iridium alloys and being plated with material selected from the group consisting of nickel, gold, nickel alloys and gold alloys; and
   said wire probe having a core diameter d, a thickness, p, of concentrically disposed material, and an offset L, said offset being the horizontal distance between the point of affixation of said wire probe to said first support and the aperture through which said wire probe extends, said values of L, p and d being conjointly selected so as to define a point lying substantially within acceptable regions indicated in FIGS. 4A through 4D.

2. The probe structure of claim 1 in which said mask has a plurality of apertures.

3. The probe structure of claim 2 further including a plurality of similarly structured wire probes affixed to said first support and extending through respective ones of said apertures.

4. The probe structure of claim 1 in which said first support comprises ceramic material.

5. The probe structure of claim 1 in which said mask comprises a polyimide layer disposed between an invar layer.

6. A wire probe, for contacting electrically conductive pads on semiconductor wafers and similar devices, said probe comprising:
   a flexible, self-supporting wire having a first end and a second, pointed end and also having two substantially oppositely directed bends therein so as to permit said wire to flex in response to force applied to said pointed end, said wire having a core diameter d, a thickness p of plated material, and an offset L, said offset being the horizontal distance between said first end and said second end, said values of L, p and d being conjointly selected so as to define a point lying in the volume shown in FIGS. 4A through 4D.

7. The wire probe of claim 6 in which said wire is substantially disposed within a single plane.

8. The wire probe of claim 6 in which said bends are disposed so that flexing of said wire occurs substantially within a single plane.

9. The wire probe of claim 6 in which said aid wire probe comprises a core material selected from the group consisting of platinum and platinum iridium alloys and which is plated with material selected from the group consisting of nickel, gold, nickel alloys, and gold alloys.

* * * * *